United States Patent
Lee et al.

(10) Patent No.: US 11,950,478 B2
(45) Date of Patent: Apr. 2, 2024

(54) DISPLAY APPARATUS

(71) Applicant: Samsung Display Co., Ltd., Yongin-Si (KR)

(72) Inventors: Kyunghoe Lee, Hwaseong-si (KR); Byungchang Yu, Seosan-si (KR); Mukyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 252 days.

(21) Appl. No.: 17/445,826

(22) Filed: Aug. 24, 2021

(65) Prior Publication Data

US 2022/0199705 A1    Jun. 23, 2022

(30) Foreign Application Priority Data

Dec. 18, 2020    (KR) .......................... 10-2020-0178614

(51) Int. Cl.
*H01L 27/32* (2006.01)
*H10K 59/121* (2023.01)
*H10K 59/35* (2023.01)

(52) U.S. Cl.
CPC ......... *H10K 59/353* (2023.02); *H10K 59/121* (2023.02); *H10K 59/352* (2023.02)

(58) Field of Classification Search
CPC ............................ H10K 59/352; H10K 59/353
See application file for complete search history.

(56) References Cited

U.S. PATENT DOCUMENTS

| 2005/0190203 | A1* | 9/2005 | Gery | G06F 9/451 |
| | | | | 345/660 |
| 2020/0251538 | A1* | 8/2020 | Zhang | G02F 1/0126 |
| 2021/0233970 | A1* | 7/2021 | Wang | G02F 1/133514 |
| 2022/0238624 | A1* | 7/2022 | Kim | H10K 59/353 |
| 2022/0310706 | A1* | 9/2022 | Yi | H10K 59/353 |

FOREIGN PATENT DOCUMENTS

| CN | 110047897 A | * | 7/2019 | ............ H10K 59/00 |
| CN | 110047897 A | | 7/2019 | |

OTHER PUBLICATIONS

Machine translation, Ma, Chinese Pat. Pub. No. CN110047897A, translation date: Jun. 6, 2023, Espacenet, all pages. (Year: 2023).*

* cited by examiner

*Primary Examiner* — Victoria K. Hall
(74) *Attorney, Agent, or Firm* — Innovation Counsel LLP

(57) ABSTRACT

A display apparatus is disclosed that includes a first display area and a second display area adjacent to the first display area. The first and second display areas include first and second light emitting areas having first and second pixel densities, respectively. The first and second light emitting areas at an interface between the first and second display areas are arranged such that in operation light emitted by the first and second light emitting areas produces a gradual decrease in light intensity from the first display area to the second display area near the interface.

13 Claims, 5 Drawing Sheets

DISPLAY APPARATUS

CROSS-REFERENCE TO RELATED APPLICATION

This application claims priority under 35 USC § 119 to Korean Patent Application No. 10-2020-0178614 filed on Dec. 18, 2020 in the Korean Intellectual Property Office (KIPO), the entire disclosure of which is incorporated herein by reference.

BACKGROUND

1. Field

The present disclosure relates to display apparatuses.

2. Description of the Related Art

A display apparatus is an apparatus that displays an image to provide a user with visual information. Among the display apparatuses, an organic light emitting diode display has been recently spotlighted.

The display apparatuses may include a first display area having a high resolution and a second display area having a lower resolution compared to the first display area. The lower resolution of the second display area allows a higher light transmittance through the second display area compared to the light transmittance through the first display area. In some display apparatuses the boundary between the first display area and the second display area may be visible because of a difference between the high resolution of the first display area and the lower resolution of the second display area.

SUMMARY

Embodiments provide a display apparatus that minimizes visual recognition of a boundary between display areas having mutually different resolutions.

An embodiment of a display apparatus includes a first display area and a second display area adjacent to the first display area. The first and second display areas include first and second light emitting areas having first and second pixel densities, respectively. The first and second light emitting areas at an interface between the first and second display areas are arranged such that in operation light emitted by the first and second light emitting areas produces a gradual decrease in light intensity from the first display area to the second display area near the interface.

A display apparatus according to an embodiment may include a display panel including a first display area and a second display area, the first display area may include a first light emitting area and a second light emitting area that emit a first color, the second display area may include a third light emitting area that emits the first color, the first light emitting area may have a size equal to a size of the second light emitting area, the third light emitting area may have a size larger than the size of the first light emitting area, the first light emitting area and the third light emitting area may be adjacent to each other in a first direction, a center of the first light emitting area and a center of the third light emitting area may be positioned on an axis extending in the first direction, the second light emitting area and the third light emitting area may be adjacent to each other in a second direction orthogonal to the first direction, and a center of the second light emitting area and a center of the third light emitting area may be positioned on an axis extending in the second direction.

In an embodiment, a first spacing distance between the centers of the first light emitting area and the third light emitting area may be equal to a second spacing distance between the centers of the second light emitting area and the third light emitting area.

In an embodiment, the first display area may include a fourth light emitting area that emits the first color. The center of the second light emitting area and a center of the fourth light emitting area may be positioned on the axis extending in the first direction. A third spacing distance between the centers of the second light emitting area and the fourth light emitting area may equal the first spacing distance.

In an embodiment, the third light emitting area included in the second display area may have a chamfered rectangular shape.

In an embodiment, the first color may be red.

In an embodiment, the second display area may be positioned at an edge of the first display area.

In an embodiment, the second display area may have a shape extending along an edge of the first display area.

In an embodiment, the first display area may have a size larger than a size of the second display area.

In an embodiment, the second display area may further include a fourth light emitting area that emits a second color different from the first color, and the third light emitting area may have a size larger than a size of the fourth light emitting area.

In an embodiment, the second display area may have a square shape.

In an embodiment, the first color may be green.

In an embodiment, a fourth spacing distance between the first light emitting area and the third light emitting area may be equal to a fifth spacing distance between the second light emitting area and the third light emitting area.

In an embodiment, the first display area further may include a fifth light emitting area spaced apart from the second light emitting area in the first direction by a sixth spacing distance, the second display area may further include a sixth light emitting area spaced apart from the third light emitting area in the first direction by a seventh spacing distance, and the seventh spacing distance may be greater than the sixth spacing distance.

In an embodiment, the second display area may include first to fourth sides, and at least one of the first to fourth sides may be adjacent to the first display area.

A display apparatus according to an embodiment may include a display panel including a first display area and a second display area, the first display area may have a first pixel density higher than a second pixel density of the second display area, the first display area may include a first light emitting area and a second light emitting area that emit a first color, the second display area may include a third light emitting area that emits the first color, the first light emitting area and the third light emitting area may be adjacent to each other in a first direction, a center of the first light emitting area and a center of the third light emitting area may be positioned on an axis extending in the first direction, the second light emitting area and the third light emitting area may be adjacent to each other in a second direction orthogonal to the first direction, and a center of the second light emitting area and the center of the third light emitting area may be positioned on an axis extending in the second direction.

In an embodiment, the first color may be red.

In an embodiment, the first display area may further include a fourth light emitting area spaced apart from the second light emitting area in the first direction by a first spacing distance, the second display area further may include a fifth light emitting area spaced apart from the third light emitting area in the first direction by a second spacing distance, and the first spacing distance may be smaller than the second spacing distance.

In an embodiment, the first display area may have a resolution higher than a resolution of the second display area.

In an embodiment, the first display area may have a size larger than a size of the second display area.

In the display apparatus according to embodiments of the present invention, the first display area and the second display area having mutually different resolutions may include light emitting areas, respectively. The first display area may include a first light emitting area and a second light emitting area. A third light emitting area may be included in the second display area. The first light emitting area and the third light emitting area may be positioned on an axis extending in a first direction. The second light emitting area and the third light emitting area may be positioned on an axis extending in a second direction orthogonal to the first direction.

By positioning centers of the first to third light emitting areas on the same axis, an interval of a boundary between the first display area and the second display area may be constantly maintained. Accordingly, the display apparatus according to embodiments of the present invention may prevent color mixing between light emitting areas that emit mutually different colors while keeping a narrow interval of the boundary between the first display area and the second display area. Thus, the boundary may not be visually recognized, and the display quality of the display apparatus may be improved.

However, the effects of the present invention are not limited to the above-described effects, and may be variously extended without departing from the spirit and scope of the present invention.

DETAILED DESCRIPTION OF THE EMBODIMENTS

Figure 1:
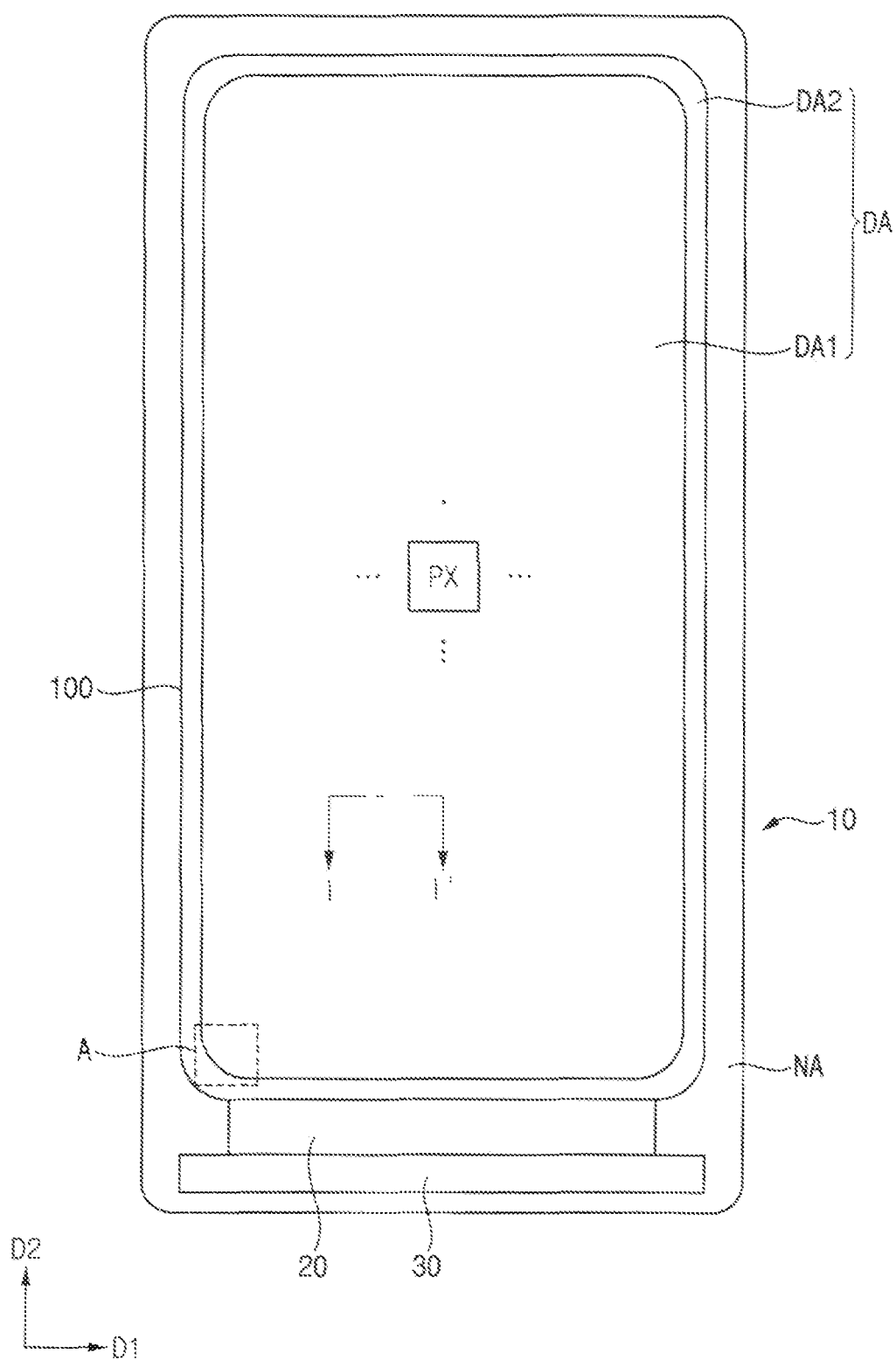
FIG. 1 is a plan view of a display apparatus according to an embodiment of the present invention.

Hereinafter, display devices in accordance with embodiments will be described in more detail with reference to the accompanying drawings. The same reference numerals are used for the same components in the drawings, and redundant descriptions of the same components will be omitted.

FIG. 1 is a plan view of a display apparatus according to an embodiment of the present invention.

Figure 2:
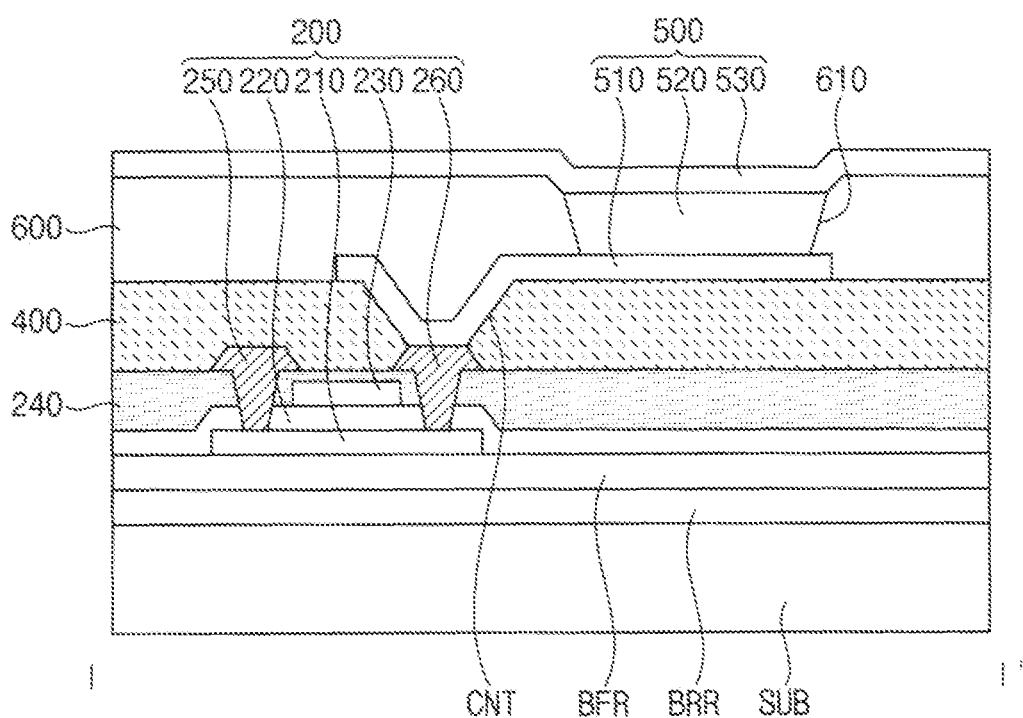
FIG. 2 is a sectional view taken along line I-I' of FIG. 1.

Referring to FIGS. 1 and 2, the display apparatus 10 may include a display panel 100, a flexible circuit board 20 connected to the display panel 100, and a driving device having a driving chip 30, etc.

The display panel 100 may include a display area DA in which an image is displayed and a non-display area NA surrounding the display area DA. The display area DA may correspond to a screen, and the non-display area NA may correspond to a bezel. Light emitting areas PX in the formed of a matrix may be arranged in the display area DA. Circuits and/or signal lines for generating and/or transmitting signals applied to the display area DA may be disposed in the non-display area NA.

A scan line, a light emission control line, a data line, a driving voltage line, and the like may be connected to each of the light emitting areas PX. The light emitting areas PX may receive a scan signal, a light emission control signal, a data signal, a driving voltage, and the like from the signal lines.

The display area DA may include a first display area DA1 and a second display area DA2. The second display area DA2 may have various functions in addition to a function of displaying an image. Accordingly, the transmittance of the second display area DA2 may be higher than that of the first display area DA1. The transmittance may refer to the transmittance of light passing through the display panel 100. The light may be light having a specific wavelength other than visible light, such as infrared light, but may include visible light.

A ratio of an area occupied by the light emitting areas PX in the second display area DA2 may be smaller than a ratio of an area occupied by the light emitting areas PX in the first display area DA1. For example, the second display area DA2 may include the light emitting area PX and a transmission area, and the transmission area may have a higher transmittance than the light emitting area PX. The light emitting area PX may be a minimum unit constituting a screen, that is, a minimum unit for displaying an image. Each of the light emitting areas PX may display a specific color, for example, any one of red, green, and blue with various brightness according to an input image signal.

The driving chip 30 and the flexible circuit board 20 may be positioned in the non-display area NA of the display panel 100. The driving chip 30 may be mounted on the flexible circuit board 20 in a chip on film method. The driving chip 30 may be mounted on the flexible circuit board 20 and electrically connected to the display panel 100.

The flexible circuit board 20 may be a circuit board that supplies a driving signal to the display apparatus 10. The flexible circuit board 20 may include a timing controller and a power voltage generator. The timing controller may generate a control signal for driving the display apparatus 10. The power voltage generator may generate a power voltage.

The display area DA may display an image based on a driving signal applied to the plurality of light emitting areas PX disposed on the substrate SUB. The light emitting areas PX may be arranged in the form of a matrix along a first direction D1 and a second direction D2 orthogonal to the first direction D1.

The display panel 100 includes the substrate SUB, a barrier layer BRR, a buffer layer BFR, a transistor 200, an interlayer insulating layer 240, an insulating layer 400, a pixel defining layer 600, and a light emitting diode. 500.

The light emitting areas PX may be formed on the substrate SUB. The substrate SUB may be continuously arranged across the first display area DA1 and the second display area DA2.

The substrate SUB may include various materials. For example, the substrate SUB may be formed of a glass material containing SiO$_2$ as a main component. However, the substrate SUB is not necessarily limited thereto, and may be formed of a plastic material.

The barrier layer BRR may be positioned on the substrate SUB. The barrier layer BRR may prevent external foreign substances from penetrating into the display apparatus 10 through the substrate SUB. The buffer layer BFR may be positioned on the barrier layer BRR. The buffer layer BFR may flatten one surface of the substrate SUB or prevent impurities from being diffused.

The transistor 200 may be positioned on the buffer layer BFR. The transistor 200 may include a semiconductor layer 210, a gate insulating layer 220, a gate electrode 230, a source electrode 250, and a drain electrode 260. The semiconductor layer 210 may include polycrystalline silicon, amorphous silicon, or oxide semiconductor.

The gate insulating layer 220 may be positioned on the semiconductor layer 210. The gate electrode 230 may be positioned on the gate insulating layer 220. The gate electrode 230 may be insulated from the semiconductor layer 210 by the gate insulating layer 220. The gate insulating layer 220 may be positioned to overlap the entire surface of the substrate SUB. The gate insulating layer 220 may include an inorganic insulating material such as silicon oxide (SiOx) or silicon nitride (SiNx).

The interlayer insulating layer 240 may be positioned on the gate electrode 230. The interlayer insulating layer 240 may include an inorganic material. The source electrode 250 and the drain electrode 260 of the transistor 200, a data line, and a signal line (not shown) may be positioned on the interlayer insulating layer 240. Each of the source electrode 250 and the drain electrode 260 may come into contact with one region of the semiconductor layer 210 through openings formed in the interlayer insulating layer 240 and may be electrically connected to the semiconductor layer 210. For example, the source electrode 250 and the drain electrode 260 may come into contact a source region and a drain region of the semiconductor layer 210, respectively.

The insulating layer 400 may be positioned on the interlayer insulating layer 240. The insulating layer 400 may serve to eliminate and planarize a step difference in order to increase light emitting efficiency of the light emitting layer 520 disposed thereon. The insulating layer 400 may overlap the transistor 200 to cover the transistor 200. The insulating layer 400, for example, may include an organic material. The organic material may include polyimide, polyamide, polyacrylate, unsaturated polyester, epoxy resin, phenol resin, and the like, but it is not limited thereto.

The insulating layer 400 may include a contact hole CNT. The contact hole CNT may mean a portion defined by removing a portion of the insulating layer 400 and formed through the insulating layer 400. The pixel electrode 510 may be positioned on the insulating layer 400. The pixel electrode 510 may overlap the contact hole CNT. The pixel electrode 510 may include a reflective conductive material, a semi-transparent conductive material, or a transparent conductive material. For example, the pixel electrode 510 may include at least one of a transparent conductive material such as indium tin oxide (ITO) and indium zinc oxide (IZO), and metal such as lithium (Li), calcium (Ca), aluminum (Al), silver (Ag), magnesium (Mg) and gold (Au).

The pixel defining layer 600 may be formed on the pixel electrode 510. The pixel defining layer 600 may have an opening 610 overlapping the pixel electrode 510. The light emitting layer 520 may be formed in the opening 610. A common electrode 530 for transmitting a common voltage may be positioned on the light emitting layer 520. The common electrode 530 may include a transparent conductive material such as indium tin oxide (ITO) and indium zinc oxide (IZO). The common electrode 530 may be formed to have light transmittance by laminating metals such as calcium (Ca), barium (Ba), magnesium (Mg), aluminum (Al), and silver (Ag).

The pixel electrode 510, the light emitting layer 520, and the common electrode 530 may constitute the light emitting diode 500. The pixel electrode 510 may be an anode, which is a hole injection electrode, and the common electrode 530 may be a cathode, which is an electron injection electrode. Otherwise, the pixel electrode 510 may be a cathode, and the common electrode 530 may be an anode.

Figure 3:
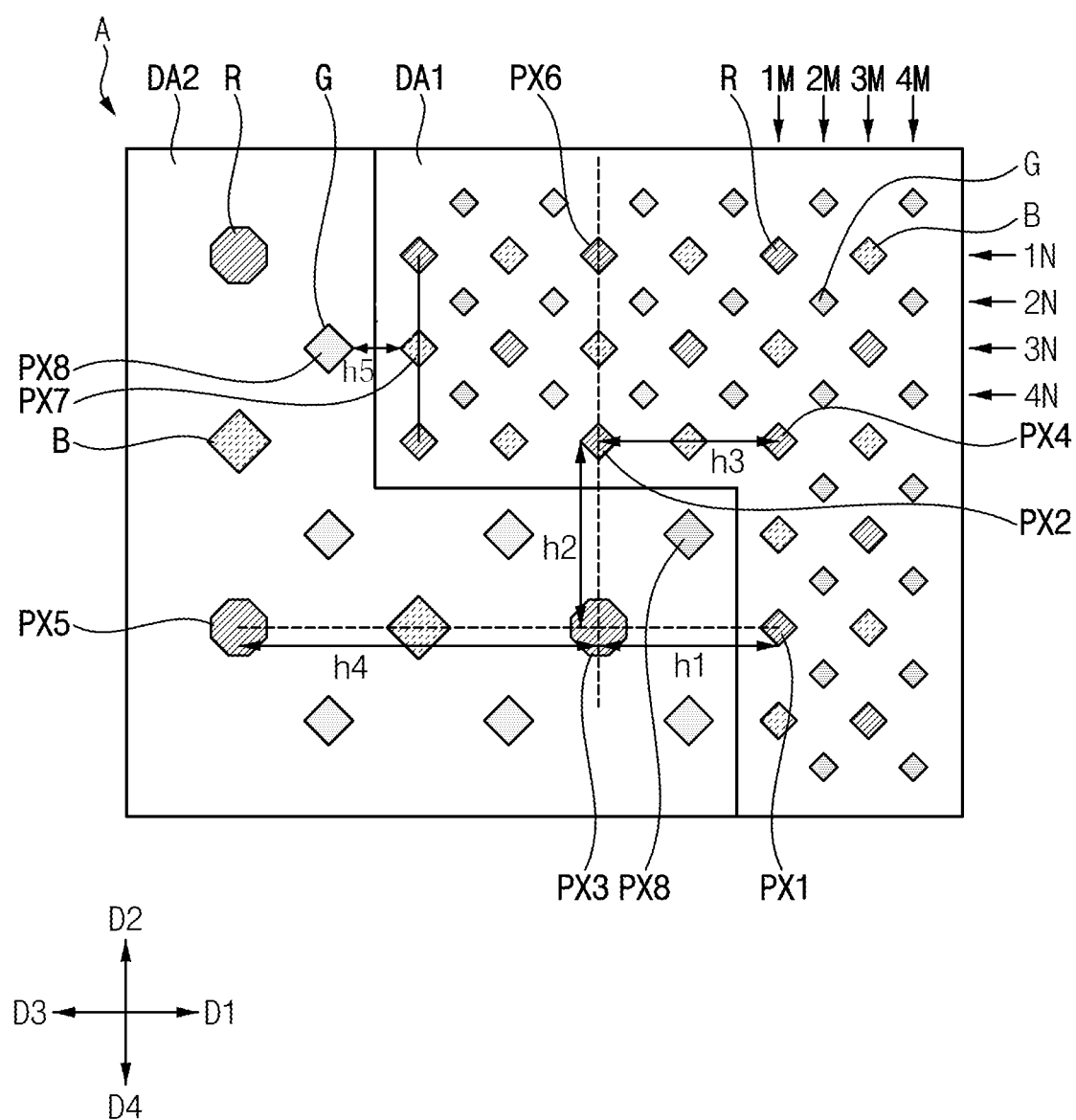
FIG. 3 is an enlarged view of an area A shown in FIG. 1.

FIG. 3 is an enlarged view of an area A shown in FIG. 1.

Referring to FIGS. 1 and 3, the display apparatus 10 may include a first display area DA1 and a second display area DA2. The second display area DA2 may be located at an edge of the first display area DA1. That is, the second display area DA2 may have a shape surrounding the first display area DAL The second display area DA2 may be positioned at an edge of the first display area DA1 in the form of a band having a narrow width.

The second display area DA2 may have a shape extending along an edge portion of the first display area DAL The edge portion may represent four edges of the first display area DAL Specifically, each of the four edges of the first display area DA1 may have a curved shape. In addition, since the second display area DA2 is disposed at the edge of the first display area DA1, each of the four edges of the second display area DA2 may also have a curved shape. However, when a boundary between the first display area DA1 and the second display area DA2 is enlarged, the boundary between the first display area DA1 and the second display area DA2 may have a step shape.

The first display area DA1 and the second display area DA2 may include a plurality of light emitting areas PX. The size of the light emitting areas included in the first display area DA1 may be smaller than the size of the light emitting areas included in the second display area DA2. Red light emitting areas R and blue light emitting areas B may be alternately disposed in a first row 1N based on the first display area DA1. A plurality of green light emitting areas G may be disposed in a second row 2N adjacent to the first row 1N while being spaced apart from each other by a predetermined interval. Blue light emitting areas B and red light emitting areas R may be alternately disposed in a third row 3N adjacent to the second row 2N, and a plurality of green light emitting areas G may be disposed in a fourth row 4N adjacent to the third row 3N while being spaced apart from each other by a predetermined interval. Such an arrangement of the light emitting areas may be repeated up to an N$^{th}$ row.

In this case, the plurality of red light emitting areas R and blue light emitting areas B disposed in the first row 1N may be offset from the plurality of green light emitting areas G disposed in the second row 2N. Accordingly, the red light emitting areas R and the blue light emitting areas B may be alternately disposed in a first column 1M. A plurality of green light emitting areas G may be disposed in a second column 2M adjacent to the first column 1M while being spaced apart from each other by a predetermined interval. The blue light emitting areas B and red light emitting areas R may be alternately disposed in a third column 3M adjacent to the second column 2M, and a plurality of green light emitting areas G may be disposed in a fourth column 4M adjacent to the third column 3M while being spaced apart from each other by a predetermined interval. Such an arrangement of the light emitting areas may be repeated up to an $M^{th}$ column.

A spacing distance in the first direction D1 and the second direction D2 between the red light emitting areas R included in the first display area DA1 may be substantially the same. A spacing distance in the first direction D1 and the second direction D2 between the blue light emitting areas B included in the first display area DA1 may be substantially the same. A spacing distance in the first direction D1 and the second direction D2 between the green light emitting areas G included in the first display area DA1 may be the same. That is, the distance between the light emitting areas that emit the same color in the first display area DA1 may be constant.

Such an arrangement structure for the light emitting areas may be referred to as a PENTILE® matrix. The rendering driving for expressing colors by sharing adjacent light emitting areas may be applied to the PENTILE® matrix. Therefore, the high resolution may be implemented with a small number of light emitting areas. In the same way, the PENTILE® matrix structure may be applied to the second display area DA2. However, embodiments of the present invention are not limited thereto, and the light emitting areas may be arranged in a stripe shape or various shapes in other embodiments.

The red light emitting areas R included in the first display area DA1 may have the same size. The blue light emitting areas B included in the first display area DA1 may have the same size. The green light emitting areas G included in the first display area DA1 may have the same size. Similarly, the red light emitting areas R, the blue light emitting areas B, and the green light emitting areas G included in the second display area DA2 may have the same sizes, respectively, that is, the light emitting areas that emit the same color may have the same size.

The red light emitting areas R and the blue light emitting areas B included in the first and second display areas DA1 and DA2 may be larger than the green light emitting areas G in the first and second display areas DA1 and DA2, respectively. The number of green light emitting areas G may be greater than the number of red light emitting areas R and the number of blue light emitting areas B.

In an embodiment, the first display area DA1 and the second display area DA2 may include a plurality of light emitting areas PX. For example, the first display area DA1 may include a first light emitting area PX1 and a second light emitting area PX2. The second display area DA2 may include a third light emitting area PX3. The first light emitting area PX1, the second light emitting area PX2, and the third light emitting area PX3 may emit a first color. The first color may be red. Since the red light emitting areas R are larger than the blue light emitting areas B and the green light emitting areas G, it is more effective to arrange the light emitting areas based on the red light emitting areas R in order to prevent color mixing. However, the first color may be blue or green in another embodiment.

Each of the light emitting areas included in the first display area DA1 may have a size smaller than a size of each of the light emitting areas included in the second display area DA2. Accordingly, the size of the third light emitting area PX3 may be larger than the size of the first light emitting area PX1 and the second light emitting area PX2.

The first light emitting area PX1 and the third light emitting area PX3 may be adjacent to each other in the first direction D1. The center of the first light emitting area PX1 and the center of the third light emitting area PX3 may be positioned on an axis extending in the first direction D1. The second display area DA2 may further include a fifth light emitting area PX5 spaced apart from the third light emitting area PX3 in the third direction D3 opposite to the first direction D1. Similarly, the center of the third light emitting area PX3 and the center of the fifth light emitting area PX5 may be positioned on an axis extending in the first direction D1. In conclusion, the centers of the red light emitting areas R, which are adjacent to the centers of the first light emitting area PX1, the third light emitting area PX3, and the fifth light emitting area PX5 in the first direction D1 and the third direction D3, may be positioned on an axis extending in the first direction D1.

The second light emitting area PX2 and the third light emitting area PX3 may be adjacent to each other in the second direction D2. The center of the second light emitting area PX2 and the center of the third light emitting area PX3 may be positioned on an axis extending in the second direction D2. The first display area DA1 may further include a sixth light emitting area PX6 spaced apart from the second light emitting area PX2 in the second direction D2. In the same way, the center of the second light emitting area PX2 and the center of the sixth light emitting area PX6 may be positioned on an axis extending in the second direction D2. In conclusion, the centers of the red light emitting areas R, which are adjacent to the centers of the second light emitting area PX2, the third light emitting area PX3, and the sixth light emitting area PX6 in the second direction D2, may be positioned on an axis extending in the second direction D2.

In an embodiment, the center of the third light emitting area PX3 may deviate by a predetermined range from an axis extending in the first direction D1 passing through the center of the first light emitting area PX1. Specifically, the size of the predetermined range may be about ¼ of the length of the first light emitting area PX1 in the second direction D2. That is, the center of the third light emitting area PX3 may be spaced apart from the center of the first light emitting area PX1 in the second direction D2 within about ¼ of the length in the second direction D2. In addition, the center of the third light emitting area PX3 may be spaced apart from the center of the first light emitting area PX1 in the fourth direction D4 opposite to the second direction D2 within about ¼ of the length in the second direction. The same rule may be applied to the third light emitting area PX3 and the second light emitting area PX2.

A first spacing distance h1 between the first light emitting area PX1 and the third light emitting area PX3 may be substantially the same as a second spacing distance h2 between the second light emitting area PX2 and the third light emitting area PX3. The spacing distance may refer to a distance between the centers of the light emitting areas. The first light emitting area PX1 and the second light emitting area PX2 may be adjacent to a boundary portion of the first display area DA1, and the third light emitting area PX3 may be adjacent to a boundary portion of the second display area DA2. Other light emitting areas, which are adjacent to the boundary portion of the first display area DA1 and the second display area DA2 and emit a first color, may also have the same spacing distance in the first direction D1 and the second direction D2. Accordingly, an interval between the first display area DA1 and the second display area DA2 may be constant as a whole.

The third light emitting area PX3 may have a chamfered rectangular shape. That is, the third light emitting area PX3 may have an octagonal shape. When the third light emitting area PX3 has an octagonal shape, an interval between the first light emitting area PX1 and the third light emitting area PX3 and an interval between the second light emitting area PX2 and the third light emitting area may be kept longer. Specifically, the interval between the first light emitting area PX1 and the third light emitting area PX3 may refer to the distance from a first edge of the first light emitting area PX1 to a first side of the third light emitting area PX3. The first edge may be an edge adjacent to the third light emitting area PX3 among edges of the first light emitting area PX1. The first side may be a side adjacent to the first light emitting area PX1 among sides of the third light emitting area PX3. Accordingly, color mixing between the third light emitting area PX3 and other light emitting areas adjacent to the third light emitting area PX3 may be prevented.

The first display area DA1 may include a fourth light emitting area PX4 that emits a first color the same as the first color emitted from the second light emitting area PX2 and is spaced apart from the second light emitting area PX2 in the first direction D1. The first spacing distance h1 between the first light emitting area PX1 and the third light emitting area PX3 may be substantially the same as a third spacing distance h3 between the second light emitting area PX2 and the fourth light emitting area PX4. Accordingly, a spacing distance in the first direction D1 and the second direction D2 between the red light emitting areas R included in the first display area DA1, a spacing distance in the first direction D1 and the second direction D2 between the red light emitting areas R included in the second display area DA2, and a spacing distance in the first direction D1 and the second direction D2 between the red light emitting areas R adjacent to the boundary portion of the first display area DA1 and the second display area DA2 may be substantially the same.

Therefore, the interval between the first display area DA1 and the second display area DA2 may be kept constant. The interval between the first display area DA1 and the second display area DA2 may refer to the distance between the light emitting area closest to the second display area DA2 among the light emitting areas included in the first display area DA1 and the light emitting area closest to the first display area DA1 among the light emitting areas included in the second display area DA2.

For example, the first display area DA1 may include a seventh light emitting area PX7 closest to the second display area DA2. In addition, the second display area DA2 may include an eighth light emitting area PX8 closest to the first display area DA1. A distance h5 between the seventh light emitting area PX7 and the eighth light emitting area PX8 may refer to an interval between the first display area DA1 and the second display area DA2.

As a result, the interval between the first display area DA1 and the second display area DA2 in the display apparatus 10 may be kept narrow. Accordingly, a boundary portion between the first display area DA1 and the second display area DA2 may not be visually recognized.

The eighth light emitting area PX8 may emit a second color different from the first color. The second color may be green. The size of the eighth light emitting area PX8 may be smaller than the size of the third light emitting area PX3. Since the size of the eighth light emitting area PX8 adjacent to the first display area DA1 is smaller than the size of the third light emitting area PX3, color mixing can be prevented when the display apparatus 10 is manufactured.

In an embodiment, the first display area DA1 may have a higher density than the second display area DA2. The first display area DA1 may display an image. The second display area DA2 may have other functions in addition to the function of displaying an image. Further, the second display area DA2 may have the transmittance higher than the transmittance of the first display area DA1. To this end, the second display area DA2 may have a lower density of the light emitting areas PX than the first display area DA1. Accordingly, in the first display area DA1 in which an image is displayed, the density of the light emitting areas PX may increase, so that the resolution of the first display area DA1 may be increased. The density of the light emitting areas PX of the second display area DA2 may be lowered, so that the transmittance of the second display area DA2 may be increased.

The light emitting areas included in the first display area DA1 may have sizes smaller than sizes of the light emitting areas included in the second display area DA2. Accordingly, the first display area DA1 may include more light emitting areas than the second display area DA2. Thus, the resolution of the first display area DA1 may be higher than the resolution of the second display area DA2. In addition, in order to ensure the high resolution over the whole area of the display apparatus 10, the first display area DA1 may have a size larger than a size of the second display area DA2.

As described above, the first display area DA1 may include the fourth light emitting area PX4 spaced apart from the second light emitting area PX2 in the first direction D1 by the third spacing distance h3. The second display area DA2 may further include a fifth light emitting area PX5 spaced apart from the third light emitting area PX3 in the third direction D3 by a fourth spacing distance h4. The third spacing distance h3 may be smaller than the fourth spacing distance h4. A distance between the light emitting areas included in the first display area DA1 may be smaller than a distance between the light emitting areas included in the second display area DA2. That is, the density of the first display area DA1 may be higher than the density of the second display area DA2.

Since the interval between the first display area DA1 and the second display area DA2 having mutually different resolutions is kept narrow, the boundary portion between the first display area DA1 and the second display area DA2 may not be visually recognized. In addition, color mixing can be prevented by maintaining a constant interval between the first display area DA1 and the second display area DA2.

Figure 4:
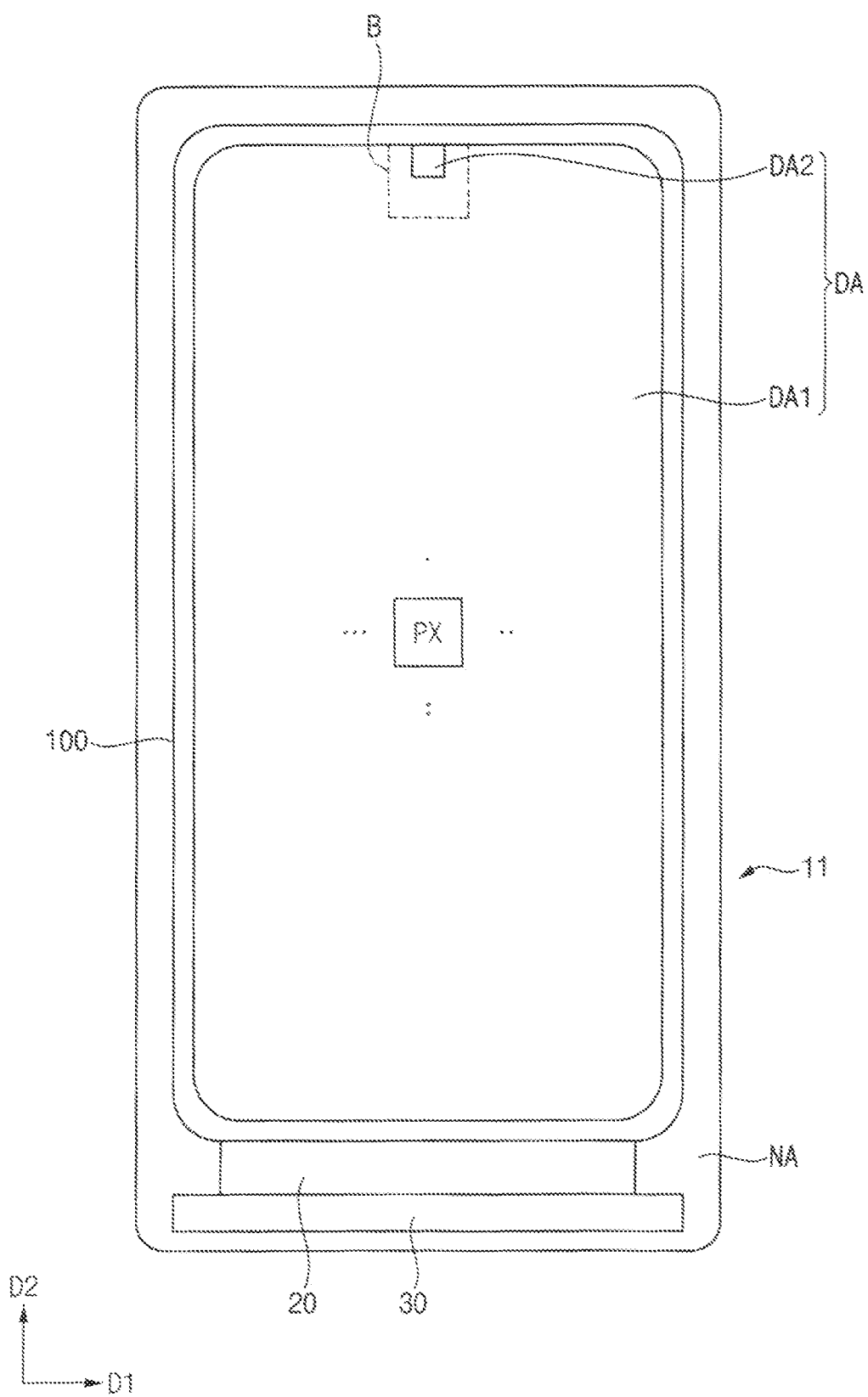
FIG. 4 is a plan view illustrating a display apparatus according to an embodiment of the present invention.
Figure 5:
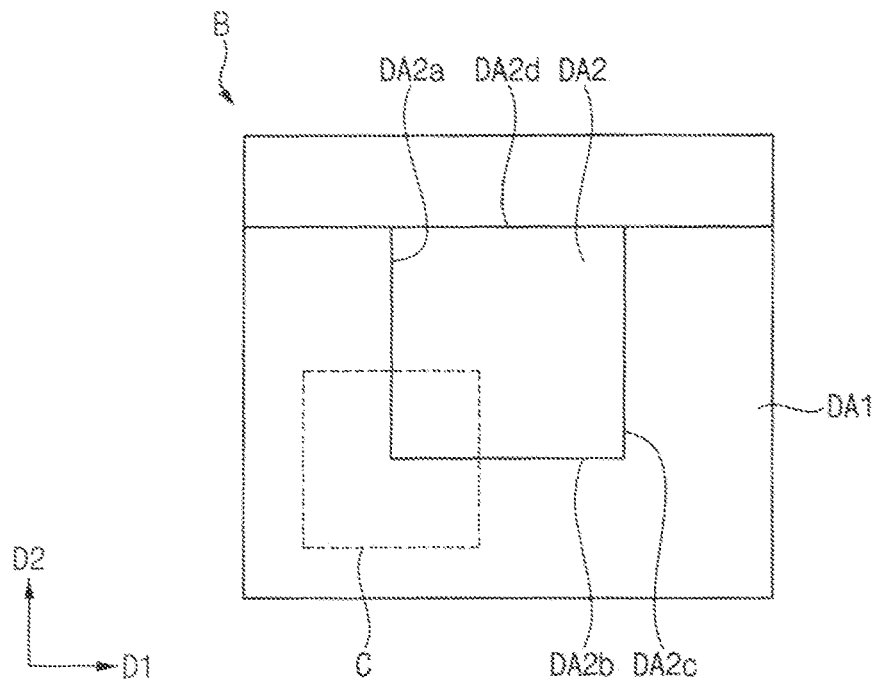
FIG. 5 is an enlarged plan view of an area B shown in FIG. 4.
Figure 6:
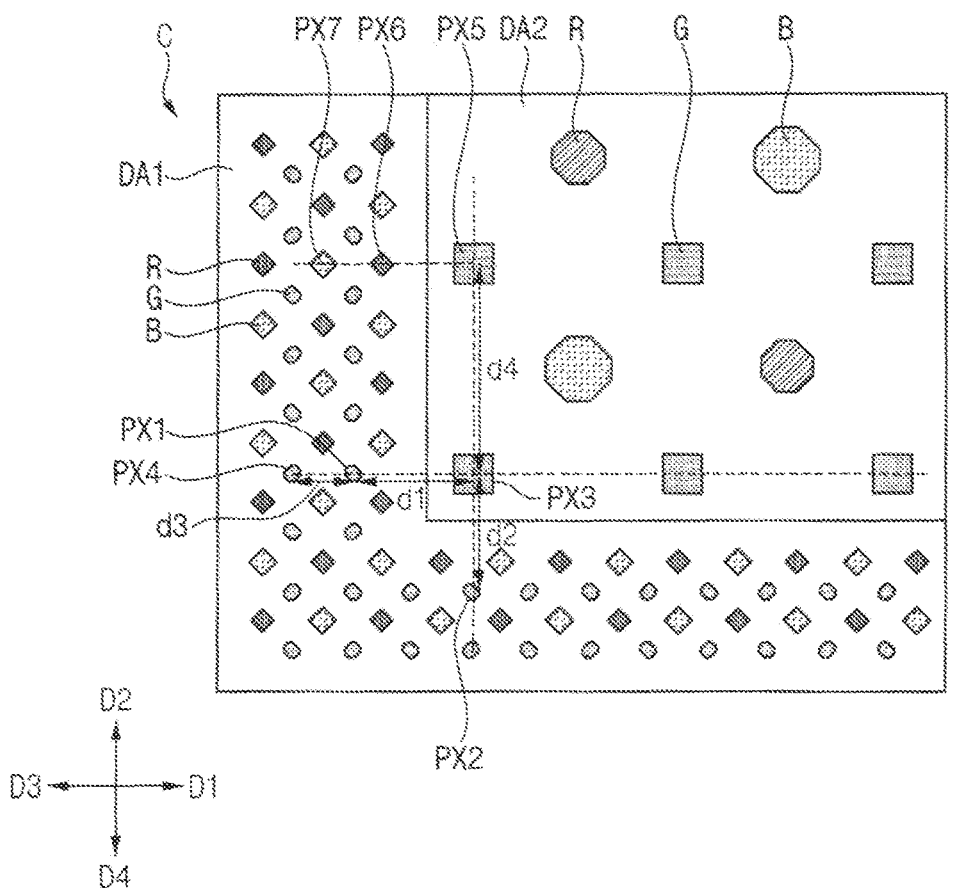
FIG. 6 is an enlarged plan view of an area C shown in FIG. 5.

FIG. 4 is a plan view illustrating a display apparatus according to an embodiment of the present invention. FIG. 5 is an enlarged plan view of an area B shown in FIG. 4. FIG. 6 is an enlarged plan view of an area C shown in FIG. 5.

Among the configurations of the display apparatus 11 described with reference to FIGS. 4 to 6, description about the components the same as those of the display apparatus 10 will be omitted because they have been described with reference to FIGS. 1 to 3.

Referring to FIGS. 4 to 6, the display apparatus 11 may include a display panel 100, a printed circuit board 20 connected to the display panel 100, and a driving device including a driving chip 30 and the like.

The display panel 100 may include a substrate SUB, a barrier layer BRR, a buffer layer BFR, a transistor 200, an interlayer insulating layer 240, an insulating layer 400, a pixel defining layer 600, and a light emitting diode. 500).

The display panel 100 may include a first display area DA1 and a second display area DA2. The second display area DA2 may be positioned above the first display area DA1. The second display area DA2 may be positioned on the left or right side at the top of the display area DA, and may be separately positioned on the left and the right side at the top of the display area DA without being located on the center. The first display area DA1 may have a shape surrounding the second display area DA2.

The second display area DA2 may have a square shape. Specifically, the second display area DA2 may include first to fourth sides DA2a, DA2b, DA2c, and DA2d. One or more of the first to fourth sides DA2a, DA2b, DA2c, and DA2d of the second display area DA2 may be adjacent to the first display area DA1. Specifically, first to third sides DA2a, DA2b, and DA2c of the second display area DA2 may be adjacent to the first display area DA1. However, embodiments of the present invention are not limited thereto, and only the second side DA2b of the second display area DA2 may be adjacent to the first display area DA1 in other embodiments. In addition, all of the first to fourth sides DA2a, DA2b, DA2c, and DA2d of the second display area DA2 may be adjacent to the first display area DA1 in another embodiment. Further, all of the first to fourth sides DA2a, DA2b, DA2c, and DA2d of the second display area DA2 may not be adjacent to the first display area DA1 in another embodiment.

The first display area DA1 and the second display area DA2 may include a plurality of light emitting areas PX. For example, the first display area DA1 may include a first light emitting area PX1 and a second light emitting area PX2. The second display area DA2 may include a third light emitting area PX3. The first light emitting area PX1, the second light emitting area PX2, and the third light emitting area PX3 may emit a first color. The first color may be green. The third light emitting area PX3, which is a green light emitting area, may be one of the light emitting areas in the second display area DA2 closest to the first display area DA1. In addition, the third light emitting area PX3 may be adjacent to the first display area DA1 in the third direction D3 and the fourth direction D4. Therefore, it is effective to arrange the first display area DA1 and the second display area DA2 based on the third light emitting area PX3 in order to maintain the interval between the first display area DA1 and the second display area DA2. However, the first color may be blue or red in other embodiments.

The size of each of the light emitting areas PX included in the first display area DA1 may be smaller than the size of each of the light emitting areas PX included in the second display area DA2. Accordingly, the size of the third light emitting area PX3 may be larger than the size of the first light emitting area PX1 and the second light emitting area PX2. The first light emitting area PX1 and the second light emitting area PX2 may have a rhombus shape. The third light emitting area PX3 may have a square shape.

The first light emitting area PX1 and the third light emitting area PX3 may be adjacent to each other in the first direction D1. The center of the first light emitting area PX1 and the center of the third light emitting area PX3 may be positioned on an axis extending in the first direction D1. The first display area DA1 may further include a fourth light emitting area PX4 spaced apart from the third light emitting area PX3 in a third direction D3 opposite to the first direction D1. In the same way, the center of the third light emitting area PX3 and the center of the fourth light emitting area PX4 may be positioned on an axis extending in the first direction D1. In conclusion, the centers of the green light emitting areas G adjacent to each of the first light emitting area PX1, the third light emitting area PX3, and the fourth light emitting area PX4 in the first direction D1 and the third direction D3 may be positioned on an axis extending in the first direction D1.

The second light emitting area PX2 and the third light emitting area PX3 may be adjacent to each other in the second direction D2. The center of the second light emitting area PX2 and the center of the third light emitting area PX3 may be positioned on an axis extending in the second direction D2. The second display area DA2 may further include a fifth light emitting area PX5 spaced apart from the second light emitting area PX2 in the second direction D2. In the same way, the center of the second light emitting area PX2 and the center of the fifth light emitting area PX5 may be positioned on an axis extending in the second direction D2. In conclusion, the centers of the green light emitting areas G adjacent to each of the second light emitting area PX2, the third light emitting area PX3, and the fifth light emitting area PX5 in the second direction D2 may be positioned on an axis extending in the second direction D2.

The first display area DA1 may include a sixth light emitting area PX6 adjacent to the fifth light emitting area PX5 in the third direction D3 and a seventh light emitting area PX7 adjacent to the sixth light emitting area PX6 in the third direction D3. The sixth light emitting area PX6 may emit a second color different from the first color. The seventh light emitting area PX7 may emit a third color different from the second color. In an embodiment, the second color may be red, and the third color may be blue. The center of the fifth light emitting area PX5, the center of the sixth light emitting area PX6, and the center of the seventh light emitting area PX7 may be positioned on an axis extending in the first direction D1.

A first spacing distance d1 between the first light emitting area PX1 and the third light emitting area PX3 may be substantially the same as a second spacing distance d2 between the second light emitting area PX2 and the third light emitting area PX3. Accordingly, the interval between the first display area DA1 and the second display area DA2 may be constant as a whole.

Therefore, the interval between the first display area DA1 and the second display area DA2 may be kept narrow. Accordingly, a boundary portion between the first display area DA1 and the second display area DA2 may not be visually recognized. In addition, since the distance between the centers of the light emitting areas included in each of the first and second display areas DA1 and DA2 is constant, color mixing may not occur even between the light emitting areas that emit mutually different colors.

In an embodiment, the first display area DA1 may have a higher density than the second display area DA2. The light emitting areas included in the first display area DA1 may have sizes smaller than sizes of the light emitting areas included in the second display area DA2. Accordingly, the first display area DA1 may include more light emitting areas than the second display area DA2 under the same area. Therefore, the resolution of the first display area DA1 may be higher than the resolution of the second display area DA2. In addition, in order ensure the high resolution over the whole area of the entire display apparatus 11, the first display area DA1 may have a size larger than a size of the second display area DA2.

As described above, the first display area DA1 may include the fourth light emitting area PX4 spaced apart from the first light emitting area PX1 in the third direction D3 by the third spacing distance d3. As described above, the second display area DA2 may include the fifth light emitting area PX5 spaced apart from the third light emitting area PX3 in the second direction D2 by the fourth spacing distance d4. The third spacing distance d3 may be smaller than the fourth spacing distance d4. The distance between the light emitting areas included in the first display area DA1 may be smaller than the distance between the light emitting areas included in the second display area DA2. That is, the density of the first display area DA1 may be higher than the density of the second display area DA2.

Since the interval between the first display area DA1 and the second display area DA2 having mutually different resolutions is kept narrow, the boundary portion between the first display area DA1 and the second display area DA2 may not be visually recognized. In addition, since the interval between the first display area DA1 and the second display area DA2 is maintained constant, color mixing can be prevented.

The display apparatus according to embodiments of the present invention may be applied to a display apparatus included in a computer, a notebook computer, a mobile phone, a smart phone, a smart pad, a PMP, a PDA, an MP3 player, and the like.

Although certain embodiments have been described herein, various modifications and similar arrangements of such embodiments will be apparent from this description. Accordingly, the inventive concepts are not limited to such embodiments, but rather to the scope of the appended claims.

What is claimed is:

1. A display apparatus comprising:
a display panel including a first display area and a second display area,
wherein the first display area includes a first light emitting area and a second light emitting area that emit a first color,
the second display area includes a third light emitting area that emits the first color,
the first light emitting area has a size equal to a size of the second light emitting area,
the third light emitting area has a size larger than the size of the first light emitting area,
the first light emitting area and the third light emitting area are directly adjacent to each other in a first direction,
a center of the first light emitting area and a center of the third light emitting area are positioned on an axis extending in the first direction,
the second light emitting area and the third light emitting area are adjacent to each other in a second direction orthogonal to the first direction,
a center of the second light emitting area and a center of the third light emitting area are positioned on an axis extending in the second direction, and
the first display area has a size larger than a size of the second display area.

2. The display apparatus of claim 1, wherein a first spacing distance between the centers of the first light emitting area and the third light emitting area is equal to a second spacing distance between the centers of the second light emitting area and the third light emitting area.

3. The display apparatus of claim 2, wherein the first display area includes a fourth light emitting area that emits the first color,
the center of the second light emitting area and a center of the fourth light emitting area are positioned on the axis extending in the first direction, and
a third spacing distance between the centers of the second light emitting area and the fourth light emitting area is equal to the first spacing distance.

4. The display apparatus of claim 1, wherein the third light emitting area included in the second display area has a chamfered rectangular shape.

5. The display apparatus of claim 1, wherein the first color is red.

6. The display apparatus of claim 1, wherein the second display area is positioned at an edge of the first display area.

7. The display apparatus of claim 1, wherein the second display area has a shape extending along an edge of the first display area.

8. The display apparatus of claim 1, wherein the second display area further includes a fourth light emitting area that emits a second color different from the first color, and
the third light emitting area has a size larger than a size of the fourth light emitting area.

9. A display apparatus comprising:
a display panel including a first display area and a second display area,
wherein the first display area includes a first light emitting area and a second light emitting area that emit a first color,
the second display area includes a third light emitting area that emits the first color,
the first light emitting area has a size equal to a size of the second light emitting area,
the third light emitting area has a size larger than the size of the first light emitting area,
the first light emitting area and the third light emitting area are directly adjacent to each other in a first direction,
a center of the first light emitting area and a center of the third light emitting area are positioned on an axis extending in the first direction,
the second light emitting area and the third light emitting area are adjacent to each other in a second direction orthogonal to the first direction,
a center of the second light emitting area and a center of the third light emitting area are positioned on an axis extending in the second direction,
the second display area has a square shape,
a fourth spacing distance between the first light emitting area and the third light emitting area is equal to a fifth spacing distance between the second light emitting area and the third light emitting area.

10. The display apparatus of claim 9 wherein the first color is green.

11. The display apparatus of claim 9, wherein the first display area further includes a fifth light emitting area spaced apart from the second light emitting area in the first direction by a sixth spacing distance,
the second display area further includes a sixth light emitting area spaced apart from the third light emitting area in the first direction by a seventh spacing distance, and
the seventh spacing distance is greater than the sixth spacing distance.

12. A display apparatus comprising:
a display panel including a first display area and a second display area,
wherein the first display area includes a first light emitting area and a second light emitting area that emit a first color,
the second display area includes a third light emitting area that emits the first color,
the first light emitting area has a size equal to a size of the second light emitting area,
the third light emitting area has a size larger than the size of the first light emitting area,
the first light emitting area and the third light emitting area are directly adjacent to each other in a first direction,
a center of the first light emitting area and a center of the third light emitting area are positioned on an axis extending in the first direction, the second light emitting area and the third light emitting area are adjacent to each other in a second direction orthogonal to the first direction, a center of the second light emitting area and a center of the third light emitting area are positioned on an axis extending in the second direction, the second display area has a square shape, the second display area includes first to fourth sides, and at least one of the first to fourth sides is adjacent to the first display area.

13. A display apparatus comprising:

a display panel including a first display area and a second display area, wherein the first display area includes a first light emitting area and a second light emitting area that emit a first color, the second display area includes a third light emitting area that emits the first color, the first light emitting area has a size equal to a size of the second light emitting area, the third light emitting area has a size larger than the size of the first light emitting area, the first light emitting area and the third light emitting area are adjacent to each other in a first direction, a center of the first light emitting area and a center of the third light emitting area are positioned on an axis extending in the first direction, the second light emitting area and the third light emitting area are adjacent to each other in a second direction orthogonal to the first direction, a center of the second light emitting area and a center of the third light emitting area are positioned on an axis extending in the second direction, and the first display area has a size larger than a size of the second display area.

\* \* \* \* \*